United States Patent
Tonar et al.

(10) Patent No.: US 11,531,414 B2
(45) Date of Patent: Dec. 20, 2022

(54) PIEZOELECTRIC FILMS WITH LOW HAZE AND METHODS OF MAKING AND USING

(71) Applicant: Gentex Corporation, Zeeland, MI (US)

(72) Inventors: William L. Tonar, Holland, MI (US); George A. Neuman, Holland, MI (US); Mario F. Saenger Nayver, Zeeland, MI (US); Kurtis L. Geerlings, Zeeland, MI (US); Sue F. Franz, Holland, MI (US)

(73) Assignee: GENTEX CORPORATION, Zeeland, MI (US)

( * ) Notice: Subject to any disclaimer, the term of this patent is extended or adjusted under 35 U.S.C. 154(b) by 499 days.

(21) Appl. No.: 16/822,413

(22) Filed: Mar. 18, 2020

(65) Prior Publication Data

US 2020/0301525 A1  Sep. 24, 2020

Related U.S. Application Data

(60) Provisional application No. 62/822,212, filed on Mar. 22, 2019.

(51) Int. Cl.
| | |
|---|---|
| *G06F 3/041* | (2006.01) |
| *H01L 41/113* | (2006.01) |
| *H01L 41/18* | (2006.01) |
| *H01L 41/37* | (2013.01) |
| *H01L 41/193* | (2006.01) |
| *B60R 1/12* | (2006.01) |
| *B60R 1/04* | (2006.01) |

(52) U.S. Cl.
CPC .......... *G06F 3/041* (2013.01); *H01L 41/1132* (2013.01); *H01L 41/183* (2013.01); *H01L 41/193* (2013.01); *H01L 41/37* (2013.01); *B60R 1/04* (2013.01); *B60R 1/1207* (2013.01); *B60R 2001/1223* (2013.01); *G06F 2203/04103* (2013.01)

(58) Field of Classification Search
None
See application file for complete search history.

(56) References Cited

U.S. PATENT DOCUMENTS

| | | | |
|---|---|---|---|
| 5,159,323 A | 10/1992 | Mase et al. | |
| 5,744,215 A | 4/1998 | Neuman | |
| 6,346,176 B1 | 2/2002 | Hughes | |
| 7,372,611 B2 | 5/2008 | Tonar et al. | |
| 7,746,534 B2 | 6/2010 | Tonar et al. | |
| 7,830,583 B2 | 11/2010 | Neuman et al. | |
| 8,368,992 B2 | 2/2013 | Neuman et al. | |

(Continued)

FOREIGN PATENT DOCUMENTS

| | | |
|---|---|---|
| CN | 109196673 A | 11/2019 |
| WO | 2004053909 A1 | 6/2004 |

*Primary Examiner* — Alexander G Ghyka
(74) *Attorney, Agent, or Firm* — Price Heneveld LLP; Brian James Brewer

(57) ABSTRACT

A touch-sensitive assembly and method of making includes a first electrically conductive layer disposed on a first substrate and a second electrically conductive layer disposed on a second substrate. A piezoelectric film is disposed between the first electrically conductive layer and the second electrically conductive layer. The piezoelectric film includes a plurality of aligned piezoelectric particles disposed in a polymeric matrix and is characterized by a haze value of about 5% or less.

20 Claims, 6 Drawing Sheets

(56) References Cited

U.S. PATENT DOCUMENTS

| | | |
|---|---|---|
| 9,766,528 B2 | 9/2017 | Kloeppner et al. |
| 10,017,847 B2 | 7/2018 | Luten et al. |
| 2012/0127136 A1 | 5/2012 | Schneider et al. |
| 2014/0327847 A1 | 11/2014 | Park et al. |
| 2019/0088850 A1* | 3/2019 | Tanimoto ................ C08L 67/04 |
| 2019/0352475 A1* | 11/2019 | Cakmak .............. H01L 41/0805 |

* cited by examiner

PIEZOELECTRIC FILMS WITH LOW HAZE AND METHODS OF MAKING AND USING

CROSS-REFERENCE TO RELATED APPLICATION

This application claims priority to and the benefit under 35 U.S.C. § 119(e) of U.S. Provisional Patent Application No. 62/822,212 filed on Mar. 22, 2019, entitled "PIEZOELECTRIC FILMS WITH LOW HAZE AND METHODS OF MAKING AND USING," the entire disclosure of which is hereby incorporated herein by reference.

FIELD OF THE DISCLOSURE

The present disclosure generally relates to piezoelectric films for use in touch-sensitive assemblies. More specifically, the present disclosure relates to piezoelectric films having a low haze and methods of making and using said low haze piezoelectric films in touch-sensitive assemblies.

BACKGROUND

Touchscreens are prevalent in displays of various consumer electronic devices. For example, consumer electronic devices such as smart phones, smart devices, music players, e-book readers, tablets, laptop computers, automated teller machines, consumer kiosks, televisions, monitors, appliance user interfaces, etc. utilize displays that include touchscreens which a user can interact with to provide input to the device. A touchscreen typically consists of a touch-sensitive assembly layered with other elements forming the screen, such as a transparent glass or plastic substrate, protective layers, anti-reflection coatings, scratch-resistant coatings, optical coatings, etc. These elements of the touchscreen are combined with a display element, such as liquid crystal display (LCD) or organic light-emitting diode (OLED) element to form the display device. Several different types of touch-sensitive assemblies can be used to provide a screen with touch-sensitive capabilities, including resistive sensing, capacitive sensing, surface acoustic wave (SAW) assemblies, infrared grid assemblies, and piezoelectric touch-sensitive assemblies. Typically, it is desirable that the touch-sensitive elements do not have optical characteristics that negatively affect the appearance of a display or an icon viewed through the touchscreen.

Piezoelectric touch-sensitive assemblies utilize piezoelectric materials which output an electrical signal in response to the application of a physical force, such as may be applied by a user's finger pressing against the touchscreen. The piezoelectric materials are typically incorporated into a film, which is layered between two electrodes. When a physical stimulus is applied to the piezoelectric film, the resulting electrical signal produces a voltage output signal which can be utilized by the device to determine the location of the stimulus on touchscreen. Conversely, an electrical signal can be applied to the touched area to provide vibration or sound as a feedback, such as a haptic feedback. Common types of piezoelectric materials include ceramics such as quartz and lead zirconate titanate (PZT). However, it can be challenging to form piezoelectric films having the desired level of sensitivity in combination with optical characteristics that do not negatively affect the appearance of a display or an icon viewed through the touchscreen.

In view of these considerations, there is a need for piezoelectric films which have sufficient sensitivity and suitable optical characteristics for use in touch-sensitive assemblies which can be incorporated into optical assemblies.

SUMMARY

According to an aspect of the present disclosure, a touch-sensitive assembly includes a first electrically conductive layer on a first substrate and a second electrically conductive layer on a second substrate. A piezoelectric film is disposed between the first conductive layer and the second conductive layer. The piezoelectric film includes a plurality of aligned piezoelectric particles disposed in a polymeric matrix and is characterized by a haze value of about 5% or less.

According to an aspect of the present disclosure, a method of making a touch-sensitive assembly is provided. The method includes providing a first electrically conductive layer on a first substrate and a second electrically conductive layer on a second substrate. A piezoelectric film is provided between the first electrically conductive layer and the second electrically conductive layer. The piezoelectric film includes a plurality of aligned piezoelectric particles disposed in a polymeric matrix and is characterized by a haze value of about 5% or less.

These and other aspects, objects, and features of the present disclosure will be understood and appreciated by those skilled in the art upon studying the following specification, claims, and appended drawings.

DETAILED DESCRIPTION

Figure 1:
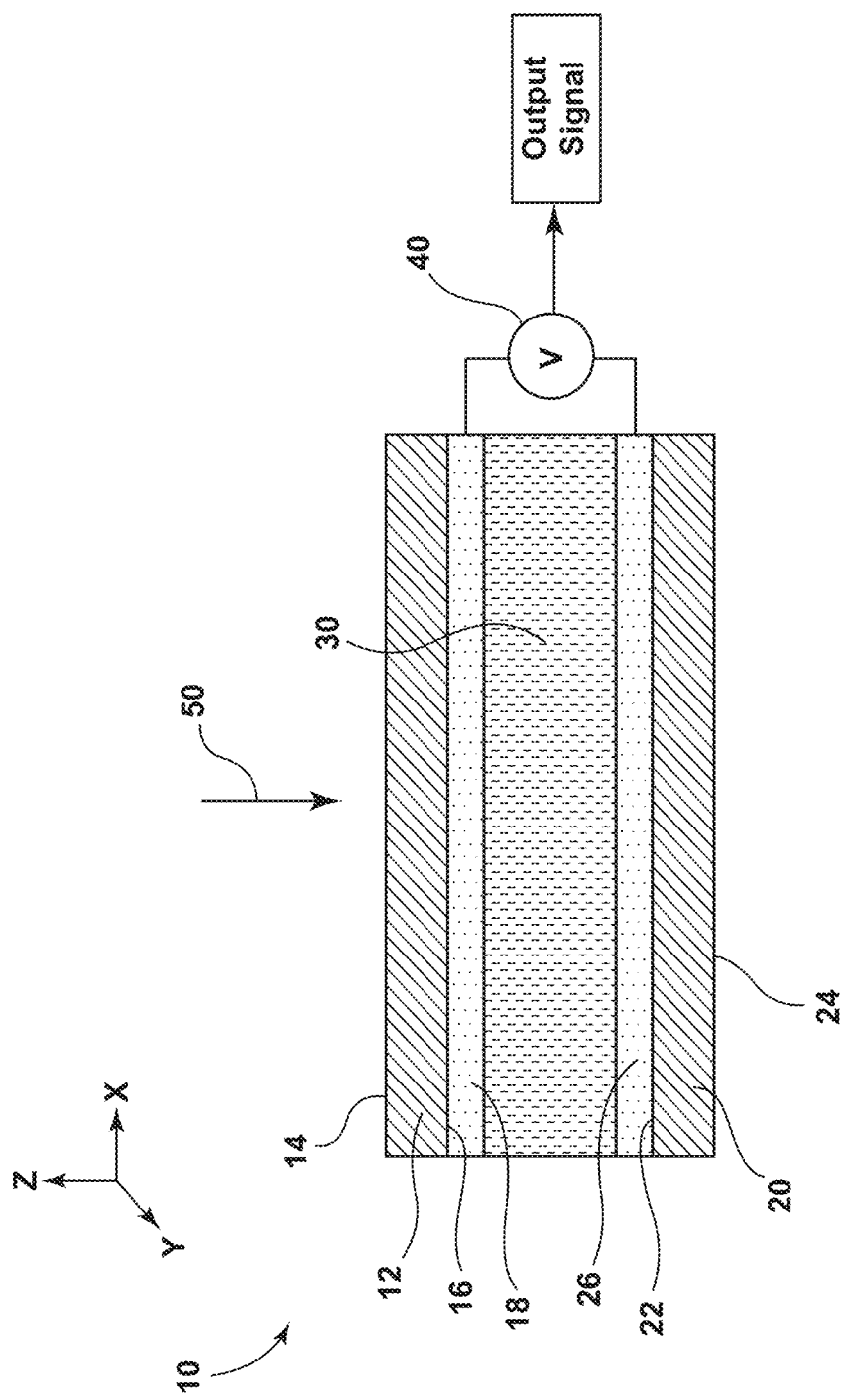
FIG. 1 is a cross-sectional schematic view of a touch-sensitive assembly, according to an aspect of the present disclosure.

The present illustrated embodiments reside primarily in combinations of materials, method steps, and apparatus components relating to touch-sensitive assemblies comprising a piezoelectric film having piezoelectric particles aligned within a polymeric matrix and wherein the piezoelectric film is characterized by a haze value of about 5% or less. The touch-sensitive assemblies of the present disclosure can be incorporated into optical assemblies including touchscreens and electronic devices incorporating touchscreens. As the haze value of a film incorporated into a touchscreen increases, the film may undesirably interfere with the optical characteristics of the touchscreen, such as clarity, brightness, aesthetic appearance, etc. Aspects of the present disclosure relate to piezoelectric films and methods of forming piezoelectric films which have a low haze value in order to decrease the effect of the piezoelectric film on the optical characteristics of the touchscreen. In one aspect the piezoelectric films and methods of forming relate to piezoelectric films that can be incorporated into touchscreens and which are characterized by a haze value of about 5% or less.

Accordingly, the apparatus components and method steps have been represented, where appropriate, by conventional symbols in the drawings, showing only those specific details that are pertinent to understanding the embodiments of the present disclosure so as not to obscure the disclosure with details that will be readily apparent to those of ordinary skill in the art having the benefit of the description herein. Further, like numerals in the description and drawings represent like elements.

In the following detailed description, for purposes of explanation and not limitation, example aspects disclosing specific details are set forth to provide a thorough understanding of various principles of the present disclosure. However, it will be apparent to one having ordinary skill in the art, having had the benefit of the present disclosure, that the present disclosure may be practiced in other aspects that depart from the specific details disclosed herein. Moreover, descriptions of well-known devices, methods and materials may be omitted so as not to obscure the description of various principles of the present disclosure.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

As used herein, the singular forms "a," "an" and "the" include plural referents unless the context clearly dictates otherwise. Thus, for example, reference to a "component" includes aspects having two or more such components, unless the context clearly indicates otherwise.

As used herein, the term "and/or," when used in a list of two or more items, means that any one of the listed items can be employed by itself, or any combination of two or more of the listed items, can be employed. For example, if a composition is described as containing components A, B, and/or C, the composition can contain A alone; B alone; C alone; A and B in combination; A and C in combination; B and C in combination; or A, B, and C in combination.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

The term "substantially transparent" as used herein will be understood by persons of ordinary skill in the art and will vary to some extent depending upon the context in which it is used. If there are uses of the term which are not clear to persons of ordinary skill in the art, given the context in which it is used, the term means that the material allows a light transmission of about 75% or more of a beam of light having a wavelength of 400 nm directed to the material at a specular angle of 10° through a thickness of 2 mm of the material. Further, "substantially transparent," as it pertains to luminous transmittance, Y, encompasses materials having a luminous transmittance of greater than about 10%.

The terms "substantially free" and "substantially absent" are used interchangeably with the terms "free" and "absent" to encompass both the complete lack of presence of a particular component as well as the presence of small, unintended amounts of material, such as due to contamination, as is understood by persons of ordinary skill in the art.

For purposes of description herein, the terms "upper," "lower," "right," "left," "rear," "front," "vertical," "horizontal," and derivatives thereof, shall relate to the disclosure as oriented in FIG. 1. Unless stated otherwise, the term "front" shall refer to the surface of the device closer to an intended viewer of the device, and the term "rear" shall refer to the surface of the device further from the intended viewer of the device. However, it is to be understood that the disclosure may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

Aspects of the present disclosure relate to a touch-sensitive assembly and methods of making and using that utilize a piezoelectric film having piezoelectric particles aligned within a polymeric matrix. The piezoelectric particles can be aligned within the polymeric matrix by applying an electric field to the film to align the piezoelectric particles vertically through a thickness dimension of the film. In some aspects, aligning the piezoelectric particles vertically within the film may increase a sensitivity of the piezoelectric film, thereby increasing the sensitivity of the touchscreen in which the touch-sensitive assembly is incorporated. In some cases, incorporation of particles into a film may increase a haze value of a film, which may undesirably affect the optical characteristics of the film. For example, as the haze value of a film increases, the film may appear visually dark or cloudy, which may decrease the clarity and/or brightness of the screen incorporating the film. Aspects of the present disclosure provide a piezoelectric film having a haze value less than about 5% to decrease an interference of the piezoelectric film with the optical characteristics of the touchscreen into which the film is incorporated.

Referring now to FIGS. 1-4, reference number 10 generally designates a touch-sensitive assembly according to an aspect of the present disclosure. The touch-sensitive assembly 10 can include a first substrate 12 having a first surface 14 and a second surface 16, and a first electrically conductive layer 18 disposed on the second surface 16. A second substrate 20 can be provided opposite the first substrate 12, and includes a third surface 22 and a fourth surface 24. A second electrically conductive layer 26 is disposed on the third surface 22. A piezoelectric film 30 is disposed between the first conductive layer 18 and the second conductive layer 26. A voltage sensor 40 can be coupled with the first conductive layer 18 and the second conductive layer 26. When a force 50 is applied to the touch-sensitive assembly 10, an electrical potential is generated across the piezoelectric film 30 which can be converted to an output signal by the voltage sensor 40. The voltage sensor 40 can be coupled with a device controller (e.g., printed circuit board, not shown) configured to receive the output signal generated by the voltage sensor 40 as an input. Additionally, the first and second conductive layers 18 and 26 may be patterned or the system may be otherwise configured to detect the location of the applied force 50.

The first substrate 12 and the second substrate 20 can be fabricated from any one of a number of materials that are transparent or substantially transparent to light in the visible region of the electromagnetic spectrum of from about 400 nm to about 700 nm. Non-limiting examples of suitable materials for the first substrate 12 and the second substrate 20 include borosilicate glass, soda lime glass, natural and synthetic polymeric resins, polyesters, such as polyethylene terephthalate (PET), polyimides (PI), polycarbonates, polysulfones, polyethylene naphthalate (PEN), ethylene vinyl acetate (EVA), acrylate polymers, cyclic olefin polymers (COP), and cyclic olefin copolymers (COC), examples of which are available from TOPAS® Advanced Polymers. While particular substrate materials have been disclosed for illustrative purposes only, it will be understood that numerous other substrate materials are likewise contemplated for use—so long as the materials are at least substantially transparent and exhibit appropriate physical properties, such as strength, to be able to operate effectively in conditions of intended use.

The first electrically conductive layer 18 and the second electrically conductive layer 26 can be any suitable electrically conductive material that is transparent or substantially transparent to visible light. Non-limiting examples of suitable electrically conductive materials include transparent conductive oxides (TCO), a conductive nanowire coating, a conductive metal mesh, an insulator/metal/insulator (IMI) stack, a transparent polymer filled with conductive nanoparticles (such as indium tin oxide particles), carbon nanotubes, graphene, and a conductive polymer, some examples of which are disclosed in U.S. Pat. Nos. 9,766,528; 7,830,583; and 8,368,992, the contents of which are incorporated herein by reference in their entirety. In some aspects, the first electrically conductive layer 18 and the second electrically conductive layer 26 can be selected from at least one of indium tin oxide (ITO), doped zinc oxide, indium zinc oxide (IZO), fluorine doped tin oxide (FTO), an insulator/metal/insulator (IMI) stack, carbon nanotubes, graphene, and combinations thereof.

The piezoelectric film 30 includes a plurality of piezoelectric particles disposed within a polymeric matrix. The piezoelectric particles are substantially aligned within the polymeric matrix along a Z-axis corresponding with a thickness of the piezoelectric film 30, i.e., the piezoelectric particles are substantially aligned along an axis extending perpendicular through the first substrate 12 and the second substrate 20. The piezoelectric particles can be any suitable material capable of generating an electrical potential in response to a physical stimulus. Non-limiting examples of suitable piezoelectric particles include quartz, lithium niobate, barium titanate, lead zirconate titanate (PZT), barium zirconate titanate (BZT), lanthanum gallium silicate (langasite), gallium orthophosphate, lithium tantalate, potassium niobite, sodium tungstate, zinc oxide, materials having a wurtzite crystal structure, sodium potassium niobate, bismuth ferrite, bismuth titanate, and combinations thereof. According to one aspect, the piezoelectric particles can be present in the polymeric matrix in an amount of from about 0.05% by weight (wt %) to about 0.5 wt %, about 0.05 wt % to about 0.25 wt %, about 0.05 wt % to about 0.1 wt %, about 0.1 wt % to about 0.25 wt %, or about 0.25 wt % to about 0.5 wt %. The piezoelectric particles may be uniformly or non-uniformly distributed throughout one or more dimensions of the polymeric matrix or localized within predetermined portions of the polymeric matrix.

The polymeric matrix can include any transparent or substantially transparent polymer. Non-limiting examples of suitable polymers include a silicone-based polymer (also referred to as polysiloxanes), polydimethylsiloxane, a polycarbonate-based polymer an acrylate-based polymer, a urethane-based polymer, and combinations thereof. The polymeric matrix can be cross-linked using a suitable cross-linking material. In one aspect, the polymer resin used to form the polymeric matrix is a thermally curable resin or a radiation curable resin. Non-limiting examples of radiation curable resins include resins that are curable using ultraviolet light (UV), electron beam, visible light, or other types of electromagnetic radiation. According to one aspect, the polymeric matrix can be characterized by a specular transmittance to light having a wavelength within the range of from about 400 nm to 700 nm of at least about 20%, at least about 30%, at least about 40%, at least about 50%, at least about 60%, at least about 70%, at least about 80%, at least about 90%, or at least about 95%. In some aspects, the polymeric matrix can be characterized by a specular transmittance to light having a wavelength within the range of from about 400 nm to 700 nm of about 20% to about 100%, about 30% to about 100%, about 40% to about 100%, about 50% to about 100%, about 60% to about 100%, about 70% to about 100%, about 80% to about 100%, about 90% to about 100%, about 20% to about 95%, about 30% to about 95%, about 40% to about 95%, about 50% to about 95%, about 60% to about 95%, about 70% to about 95%, about 80% to about 95%, about 20% to about 90%, about 30% to about 90%, about 40% to about 90%, about 50% to about 90%, about 60% to about 90%, about 70% to about 90%, or about 80% to about 90%.

According to an aspect of the present disclosure, the piezoelectric film 30 can be characterized by a haze value of about 5% or less. In some aspects, the haze value is less than about 4%, less than about 3%, less than about 2% or less than about 1%. In some aspects, the haze value is from about 0% to about 5%, about 0% to about 4%, about 0% to about 3%, about 0% to about 2%, or about 0% to about 1%. As used herein, a material's haze value is defined as the percent transmittance of light which deviates by greater than 2.5 degrees from the angle of incident light. As discussed above, as the haze value of a film increases, the extent to which the film interferes with the optical characteristics of the touchscreen may also increase. Light beams passing through and/or reflected by the polymeric matrix and/or the piezoelectric particles disposed within the polymeric matrix may scatter, resulting in an increase haze of the piezoelectric film 30. Film haze can result in a blurred image and/or the loss of light intensity due to the scattering of the reflected and/or transmitted light beams. Generally, it is desirable to minimize haze in order to not negatively affect the visual clarity and/or brightness (due to light loss) in optical applications.

Without being limited by any particular theory, it is believed that differences in an index of refraction of the piezoelectric particles and an index of refraction of the polymeric matrix can contribute to a film's haze value. As the difference in the indices of refraction of the piezoelectric particles and the polymeric matrix approach 0, the haze of the film may also approach 0; as the difference increases, the haze value may also increase. According to an aspect of the present disclosure, differences in the indices of refraction of the piezoelectric particles and the polymeric matrix can be addressed to provide the piezoelectric film 30 with the desired haze value. According to one aspect of the present disclosure, the polymeric matrix and the piezoelectric particles are configured such that a difference in the index of refraction of the piezoelectric particles and the index of refraction of the polymeric matrix is less than about ±1, as measured for at least one wavelength in the range of from about 400 nm to about 700 nm. As used herein, a difference in index of refraction of less than about ±X, where "X" is a number, is used to mean that a first index of refraction value is greater than or less than a second index of refraction value by a value of about "X" or less, end points included. According to one aspect, the difference in indices of refraction can be less than about ±1, less than about ±0.5, less than about ±0.25, or less than about ±0.1, as measured for at least one wavelength in the range of from about 400 nm to about 700 nm. For example, the difference in indices of refraction can be less than about ±1, less than about ±0.5, less than about ±0.25, or less than about ±0.1, as measured for at least one wavelength in the range of from about 400 nm to about 700 nm, about 400 nm to about 600 nm, about 400 nm to about 500 nm, about 500 nm to about 700 nm, about 500 nm to about 600 nm, or about 600 nm to about 700 nm. In some examples, the difference in indices of refraction can be less than about ±1, less than about ±0.5, less than about ±0.25, or less than about ±0.1, for each wavelength in the range of from about 400 nm to about 700 nm, about 400 nm to about 600 nm, about 400 nm to about 500 nm, about 500 nm to about 700 nm, about 500 nm to about 600 nm, or about 600 nm to about 700 nm. In yet another example, the difference in indices of refraction can be less than about ±1, less than about ±0.5, less than about ±0.25, or less than about ±0.1, as measured at about 589 nm. In some aspects, the difference in indices of refraction can be from about 0.1 to about 1, about 0.1 to about 0.5, about 0.1 to about 0.25, about 0.25 to about 1, about 0.25 to about 0.5, or about 0.5 to about 1 (absolute value), as measured for at least one wavelength in the range of from about 400 nm to about 700 nm. For example, the difference in indices of refraction can be from about 0.1 to about 1, about 0.1 to about 0.5, about 0.1 to about 0.25, about 0.25 to about 1, about 0.25 to about 0.5, or about 0.5 to about 1 (absolute value), as measured for at least one wavelength in the range of from about 400 nm to about 700 nm, about 400 nm to about 600 nm, about 400 nm to about 500 nm, about 500 nm to about 700 nm, about 500 nm to about 600 nm, or about 600 nm to about 700 nm. In some examples, the difference in indices of refraction can be from about 0.1 to about 1, about 0.1 to about 0.5, about 0.1 to about 0.25, about 0.25 to about 1, about 0.25 to about 0.5, or about 0.5 to about 1 (absolute value), for each wavelength in the range of from about 400 nm to about 700 nm, about 400 nm to about 600 nm, about 400 nm to about 500 nm, about 500 nm to about 700 nm, about 500 nm to about 600 nm, or about 600 nm to about 700 nm. In yet another example, the difference in indices of refraction can be from about 0.1 to about 1, about 0.1 to about 0.5, about 0.1 to about 0.25, about 0.25 to about 1, about 0.25 to about 0.5, or about 0.5 to about 1 (absolute value), as measured at about 589 nm.

For example, in one aspect, the polymeric matrix and the piezoelectric particles can be selected at least in part to provide a desired difference in the indices of refraction. Selecting a polymeric matrix and piezoelectric particles having a difference in indices of refraction of less than about ±1 can provide the piezoelectric film 30 with a low haze value less than about 5%. In one exemplary aspect, the polymeric matrix may be an acrylic polymer having an index of refraction of about 1.49 and the piezoelectric particles may be silica particles having an index of refraction of about 1.45. In another example, an exemplary piezoelectric film 30 can include polydimethylsiloxane as the polymeric matrix and quartz as the piezoelectric particles. The difference in refractive indices between a polydimethylsiloxane polymeric matrix and quartz particles can be less than about ±0.25, as measured for at least one wavelength in the range of from about 400 nm to about 700 nm.

In another aspect, a filler can be added to the polymeric matrix to change the index of refraction of the polymeric matrix to decrease the difference in the indices of refraction of the piezoelectric particles and the polymeric matrix. For example, in some cases, the polymeric matrix and the piezoelectric particles may be selected based on characteristics other than index of refraction, resulting in the piezoelectric particles and a polymeric matrix having a large difference in index of refraction (e.g., greater than 1, absolute value). One or more fillers can be added to the polymeric matrix to decrease the difference in index of refraction, thereby decreasing the haze of the piezoelectric film. In one aspect, the filler can be a ceramic or other material having a higher index of refraction. In one aspect, the filler particles can be selected to have a size that is smaller than the wavelength of light to be transmitted through the piezoelectric film to minimize or avoid filler particles that could scatter light and thereby increase the haze of the piezoelectric film. According to one aspect, the filler particles have a size that is less than about 75 nm, less than about 50 nm, or less than about 25 nm. The net index of refraction for the polymeric matrix including the polymer and filler composite can be approximated based on the relative amounts of polymer and filler in the composite and their respective indices of refraction according to the following formula (I):

$$\text{RI of filler composite} = (\% \text{ polymer})*(\text{RI of polymer}) + (\% \text{ filler})*(\text{RI of filler}) \quad (I)$$

where "RI of filler composite" is the net index of refraction of the mixture of polymer and filler forming the polymeric matrix, "% polymer" and "% filler" are the relative amounts of each component, and "RI of polymer" and "RI of filler" are the index of refraction of the polymer and the index of refraction of the filler, respectively, as measured for at least one wavelength in the range of from about 400 nm to about 700 nm.

In another aspect, when the polymeric matrix includes a silicone-based polymer resin, a portion of the silicon atoms in the polymeric matrix can be substituted with a metal to change the refractive index of the polymeric matrix to decrease the difference in the indices of refraction of the piezoelectric particles and the polymeric matrix. For example, a portion of the silicon atoms in a silicone-based polymer resin forming at least a portion of the polymeric matrix can be substituted with a metal atom, examples of which include titanium, vanadium, and zirconium, to change the refractive index of the polymeric matrix.

In another aspect, a difference in the indices of refraction of the piezoelectric particles and the polymeric matrix can be decreased by providing piezoelectric particles having a coating with an index of refraction intermediate between the piezoelectric particles and the polymeric matrix. In one aspect, the intermediate index of refraction may be between about 10% to about 90%, about 30% to about 70%, or about 40% to about 60% of the difference between the index of refraction of the piezoelectric particles and the index of refraction of the polymeric matrix. In another aspect, the coating can be a gradient coating having multiple indices of refraction such that the index of refraction of the materials is incrementally changed between the piezoelectric particles and the polymeric matrix. For example, the gradient coating can be characterized by a first index of refraction at an interface with the piezoelectric particle and a second index of refraction at an interface with the polymeric matrix. The first index of refraction is selected to be an intermediate value between the indices of refraction of the piezoelectric particles and the second index of refraction of the gradient coating; the second index of refraction is selected to be an intermediate value between the indices of refraction of the polymeric matrix and the first index of refraction of the gradient coating. In this manner, the first and second indices of refraction of the gradient coating can be selected such that the index of refraction incrementally transitions from the index of refraction of the piezoelectric particle to the index of refraction of the polymeric matrix. In one aspect, the gradient coating is characterized by indices of refraction that approach the index of refraction of the piezoelectric particles at the interface between the piezoelectric particle and the gradient coating and indices of refraction that approach the index of refraction of the polymeric matrix at the interface between the polymeric matrix and the gradient coating. Providing materials having intermediate indices of refraction between the piezoelectric particles and the polymeric matrix may decrease light scattering and thus decrease the haze value of the piezoelectric film 30. One or more coatings or a gradient coating having two or more transitional indices of refraction can be provided to decrease the haze value of the polymeric film 30. In one aspect, the coating and/or gradient coating can have a thickness of less than about 500 nm, less than about 250 nm, less than about 100 nm, less than about 50 nm, less than about 25 nm, or less than about 10 nm. In one aspect, the coating and/or gradient coating can have a thickness of from about 5 nm to about 500 nm, about 5 nm to about 250 nm, about 5 nm to about 100 nm, about 5 nm to about 50 nm, about 5 nm to about 25 nm, about 5 nm to about 10 nm, about 10 nm to about 500 nm, about 10 nm to about 250 nm, about 10 nm to about 100 nm, about 10 nm to about 50 nm, about 10 nm to about 25 nm, about 25 nm to about 500 nm, about 25 nm to about 250 nm, about 25 nm to about 100 nm, about 25 nm to about 50 nm, about 50 nm to about 500 nm, 100 nm to about 500 nm, about 250 nm to about 500 nm, about 50 nm to about 250 nm, about 50 nm to about 100 nm, about 100 nm to about 250 nm, or about 250 nm to about 500 nm.

In one aspect, the coating disposed on the piezoelectric particles may be formed as a single index of refraction or as a graded index of refraction coating by any suitable deposition process, non-limiting examples of which include an atomic layer deposition (ALD) process, a chemical vapor deposition (CVD) process, and a physical vapor deposition process (PVD).

According to another aspect of the present disclosure, a physical characteristic of the piezoelectric particles, such as a size, shape, and/or surface characteristic of the piezoelectric particles, can be selected to provide the piezoelectric film 30 with the desired haze level. The size, shape, and/or surface characteristics of the piezoelectric particles can optionally be utilized in combination with any of the features described herein for reducing the difference in the indices of refraction of the piezoelectric particles and the polymeric matrix. In one aspect, the piezoelectric particles can include a rounded or smoothed shape in which sharp corners and edges have been reduced. Piezoelectric particles having less angular surface dimensions may result in less scattering of light and thus decrease a haze value of the polymeric film 30. The dimensions of the piezoelectric particles can also be selected to provide the desired haze value. In one aspect, the piezoelectric particles can be characterized by a diameter less than about 1 micrometer (μm), less than about 0.5 μm, less than about 0.25 μm, or less than about 0.1 μm.

According to an aspect of the present disclosure, the piezoelectric particles can be characterized by an average surface roughness $R_a$ of less than about 5 μm. As used herein, "surface roughness ($R_a$)" and "surface roughness ($R_q$)" are given by formulas (II) and (III), respectively:

$$R_a = \frac{1}{n}\sum_{i=1}^{n} |y_i| \quad \text{(II)}$$

$$R_q = \sqrt{\frac{1}{n}\sum_{i=1}^{n} y_i^2} \quad \text{(III)}$$

where $y_i$ is the distance of a given measurement, i, from the mean roughness and n is the number of equally spaced points along the outer surface being measured for surface roughness. The average surface roughness $R_a$ of the piezoelectric particles can be less than about 1 μm, less than about 0.5 μm, less than about 250 nm, less than about 100 nm, or less than about 50 nm. In some aspects, the average surface roughness $R_a$ of the piezoelectric particles can be from about 10 nm to about 5 μm, about 10 nm to about 1 μm, about 10 nm to about 0.5 μm, about 10 nm to about 250 nm, about 10 nm to about 100 nm, about 50 nm to about 5 μm, about 50 nm to about 1 μm, about 50 nm to about 0.5 μm, about 50 nm to about 250 nm, about 50 nm to about 100 nm, about 100 nm to about 5 μm, about 100 nm to about 1 μm, about 100 nm to about 0.5 μm, about 100 nm to about 250 nm, about 250 nm to about 5 μm, about 250 nm to about 1 μm, about 250 nm to about 0.5 μm, about 0.5 μm to about 1 μm, about 0.5 μm to about 5 μm, or about 1 μm to about 5 μm.

According to one aspect of the present disclosure, a distribution and/or a localization of the piezoelectric particles in the polymeric matrix can be configured to decrease a haze value of the polymeric film 30. In one aspect, the piezoelectric particles can be dispersed evenly across an XY plane (i.e., the viewing plane) of the polymeric film 30 and the density of the piezoelectric particles can be selected to balance requirements for haze and sensitivity. A lower concentration of piezoelectric particles can reduce the haze value, but there may be a corresponding decrease in sensitivity of the piezoelectric film 30.

In one aspect, the piezoelectric particles can be present in the polymeric matrix as an array of discrete groupings of piezoelectric particles. A concentration of the piezoelectric particles within each grouping and an XY spacing (i.e., longitudinal and lateral spacing) between each group of particles can be selected to balance requirements for haze and sensitivity as desired. For example, increasing the concentration and/or size of the piezoelectric particle groupings and decreasing the spacing between groupings may increase sensitivity of the piezoelectric film 30. Decreasing the concentration and/or size of the piezoelectric particle groupings and increasing the spacing between groupings may decrease the haze value of the piezoelectric film 30. In one example, groupings of piezoelectric particles can be arrayed within the polymeric matrix with a longitudinal and lateral spacing of about 1 nm.

According to one aspect of the present disclosure, the piezoelectric particles can be localized in areas of the piezoelectric film 30 where touch-sensitivity is desired and absent in areas of the piezoelectric film 30 where touch-sensitivity is not desired. In this manner, portions of the piezoelectric film 30 which correspond to a viewing area, for example, can be free of piezoelectric particles which may scatter light and increase the haze value. The piezoelectric particles can be disposed only in those portions of the piezoelectric film 30 corresponding to touch-sensitive areas, such as user input "buttons," for example. Thus, the piezoelectric film 30 can have the touch-sensitive features of the aligned piezoelectric particles in localized portions of the piezoelectric film 30 where a low haze value may not be as critical, while the piezoelectric particles can be absent from areas where a lower haze value may be more critical, such as a viewing window. In some aspects, the piezoelectric film 30 or adjacent components, such as a cover glass or a trim piece, can include a visual indicator (e.g. color and/or graphics), to indicate the touch-sensitive areas of the piezoelectric film 30 corresponding to the presence of the piezoelectric particles.

Figure 2:
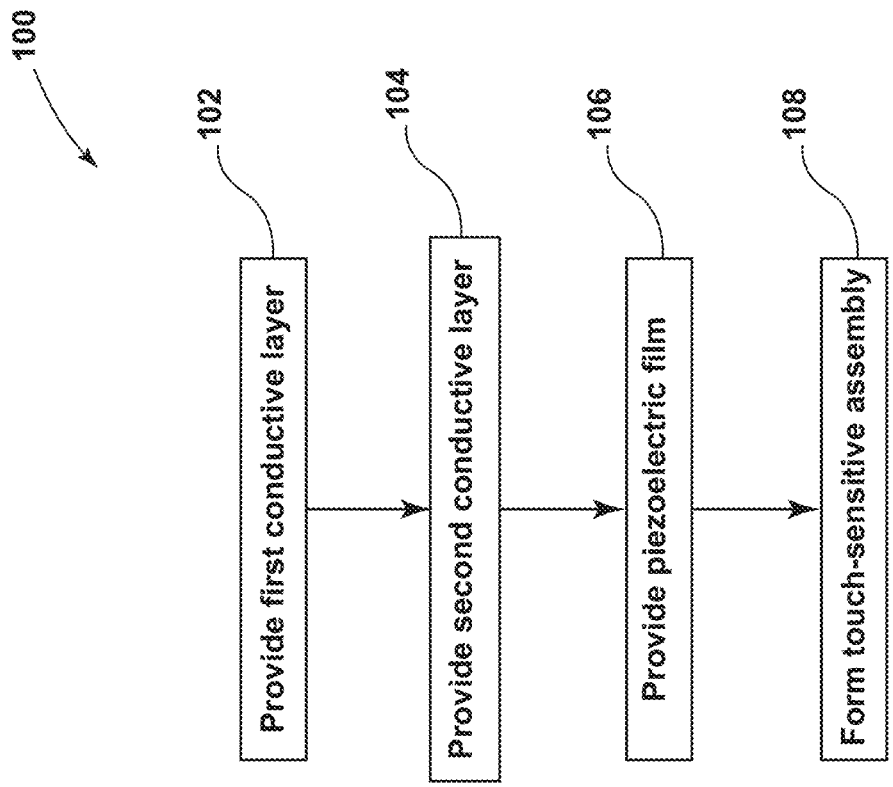
FIG. 2 is a flowchart illustrating a method of making a touch-sensitive assembly, according to an aspect of the present disclosure.

Referring now to FIG. 2, a method 100 of making a touch-sensitive assembly including the piezoelectric film according to aspects of the present disclosure is provided. While the method 100 is described in the context of the touch-sensitive assembly 10 of FIG. 1, the method 100 can also be used to make other touch-sensitive assemblies, according to an aspect of the present disclosure. The method 100 can include providing the first conductive layer 18, disposed on the first substrate 12, at 102 and the second conductive layer 26, disposed on the second substrate 20, at 104. At 106, a piezoelectric film 30 can be provided between the first and second conductive layers 18, 26. The piezoelectric film 30 provided at 106 can include a polymeric matrix having a plurality of aligned piezoelectric particles disposed therein. The piezoelectric particles can be aligned along the Z axis (i.e., the film thickness) extending between the first conductive layer and the second conductive layer, such as described above with respect to the piezoelectric film 30 of the exemplary embodiment of FIG. 1.

The first and second conductive layers 18, 26 can be formed according to any suitable process, non-limiting examples of which are disclosed in U.S. Pat. Nos. 7,746, 534; 10,017,847; and 6,346, 176, all of which are incorporated herein by reference in their entirety. In one aspect, the first and second conductive layers 18, 26 may be formed on their respective first and second substrates 12, 20 by any suitable deposition process, examples of which include a chemical vapor deposition (CVD) process or a physical vapor deposition process (PVD). In some aspects the first and second conductive layers 18, 26 may be formed by a sputtering deposition process.

The piezoelectric film 30 provided at 106 includes piezoelectric particles which have been aligned within the film 30 by exposing the film 30 to an electric field and the polymeric material is solidified around the piezoelectric particles to form the polymeric matrix. Aligning piezoelectric particles and solidifying the polymeric matrix can proceed according to any suitable process. In one aspect, the piezoelectric particles can be combined with a polymer solution including a polymer resin dispersed in a solvent. The polymer solution can then be cast onto a substrate, which may be a sacrificial substrate or a permanent substrate, such as one of the first or second conductive layers 18, 26. The cast polymer solution with piezoelectric particles dispersed therein can then be passed through an electric field of sufficient strength to align the piezoelectric particles. The solvent is then evaporated to solidify the polymer resin to form the polymeric matrix with the aligned piezoelectric particles disposed therein.

According to another aspect, the piezoelectric particles can be dispersed within a polymer resin which can be thermally cured or radiation cured (for example, using ultraviolet (UV) light or electron beam radiation) to solidify the polymer resin to form the polymeric matrix with the aligned piezoelectric particles disposed therein. The polymer with piezoelectric particles dispersed therein can be passed through an electric field of sufficient strength to align the piezoelectric particles and then the film can be subjected to a heat treatment to thermally cure the polymeric matrix or exposed to radiation to cure the polymeric matrix.

According to another aspect, the piezoelectric particles can be dispersed within a polymer melt (either a liquid or molten polymer) that is extruded through a casting die onto a substrate, which may be a sacrificial substrate or a permanent substrate, such as one of the first or second conductive layers 18, 26. The extruded polymer is then passed through an electric field of sufficient strength to align the piezoelectric particles. Optionally, heat can be applied during application of the electric field by passing the polymer melt through a heating zone, such as an oven or a laser heating zone. Depending on the nature of the polymer, the application of heat may thermally cure the polymer or remove a solvent used to disperse the polymer. The film can then be passed through a cooling station to sufficiently cool the polymer to solidify the polymer resin and form the polymeric matrix with the aligned piezoelectric particles disposed therein.

According to another aspect, the piezoelectric particles can be dispersed within a material including reactive monomers and/or prepolymers. The reactive monomers and/or prepolymers can provided as a solution, resin, melt, or gel with the piezoelectric particles dispersed therein. The material with the piezoelectric particles dispersed therein can be passed through an electric field of sufficient strength to align the piezoelectric particles within the material. The material can be treated according to any suitable method, including any of those described herein, to solidify the material to form a polymeric matrix with the aligned piezoelectric particles disposed therein. In some aspects, solidifying the material to form the polymeric matrix can include reacting and/or crosslinking the reactive monomers and/or prepolymers. For example, the material can include monomers and/or prepolymers having reactive functional groups and optionally a catalyst to facilitate reaction of the monomers and/or prepolymers to form a desired polymer and/or copolymer system. The polymerization reaction can optionally be facilitated through the use of one or more catalysts, thermal curing, and/or radiation curing. In another example, the material can include a crosslinking agent, optionally in combination with a catalyst, to crosslink at least a portion of the polymers and/or co-polymers of the material. At least one of a type and amount of monomer and/or prepolymer, optional catalyst, and/or optional crosslinking agent can be selected to provide a desired rate of polymerization and/or crosslinking to provide a material having a desired rigidity that allows the piezoelectric particles to be aligned within the material prior to solidifying the material to form the polymeric matrix having the piezoelectric particles in their aligned position. Optionally, the crosslinking agent can be a thermally curable and/or radiation curable crosslinking agent.

For example, the material can include a polyurethane-based system that includes monomers and/or prepolymers having reactive hydroxyl functional groups. The polyurethane-based system can include an isocyanate-based crosslinking agent and a suitable catalyst to facilitate reaction of the monomers/prepolymers. The components of the system can be selected to control a rate of the polymerization and/or crosslinking reaction to form a gel, for example, having a level of rigidity that allows the piezoelectric particles to be capable of being aligned within the material when the system is passed through an electric field, and which can sufficiently solidify to maintain the aligned piezoelectric particles in their aligned position.

In this manner, the piezoelectric particles can be provided with a polymeric matrix-forming material, such as a polymer solution, polymer melt, reactive monomers, reactive prepolymers, or combinations thereof to form a first material. The first material with the piezoelectric particles disposed therein can be passed through an electric field to align the piezoelectric particles according to any of the processes described herein to form a second material having the piezoelectric particles disposed therein with the desired alignment characteristics. This second material can be solidified according to any of the processes described herein to provide the polymeric matrix with aligned piezoelectric particles disposed therein in the desired alignment.

The piezoelectric particles may be aligned substantially along the Z axis or at an angle relative to the Z axis (i.e., the thickness of the film). In one aspect, the angle of alignment of the piezoelectric particles is based on a strength of the applied electric field. In one aspect, the strength of the electric field is from about 500 Volts per millimeter of film thickness (V/mm) to about 2000 V/mm. In one aspect, the applied electric field is from about 500 V/mm to about 1500 V/mm, about 500 V/mm to about 1000 V/mm, about 1000 V/mm to about 2000 V/mm, about 1000 V/mm to about 1500 V/mm, or about 1500 V/mm to about 2000 V/mm.

The polymer films can be formed according to any suitable process, non-limiting examples of which include using a doctor blade, film casting, extrusion, and casting with a slot die. In one aspect, the polymer films can be formed directly onto one of the first or second conductive layers 18, 26 prior to aligning the piezoelectric particles. In another aspect, the polymer films can be formed on a sacrificial substrate, the piezoelectric particles can be aligned within the polymeric matrix, and then the piezoelectric film can be transferred to one of the first or second conductive layers.

At step 108 of the method 100, the first conductive layer 18, second conductive layer 26, and the piezoelectric film 30 are assembled to form the touch-sensitive assembly 10 of the present disclosure. The piezoelectric particles may be aligned within the film 30 before or after the film 30 is assembled with one or more of the first and second conductive layers 18, 26. The different layers of the touch-sensitive assembly 10 can be held together in any suitable manner used to form multi-layer touchscreens, including adhesives, sealants, tie-layers, bezels, frames, etc. . . . . . Depending on the electronic device into which the touch-sensitive assembly 10 is to be used, a bezel or trim piece may be used to secure the components of the touch-sensitive assembly 10 relative to one another. The touch-sensitive assembly 10 may be assembled separately from the remaining components of the touchscreen or may be assembled at the same time with other components of the touchscreen and/or the electronic device. Non-limiting examples of edge-sealing materials and methods can be found in U.S. Pat. No. 7,372,611, entitled "Vehicular Rearview Mirror Elements and Assemblies Incorporating These Elements," issued May 13, 2008, which is incorporated herein by reference in its entirety. As discussed above, the touch-sensitive assembly 10 can be coupled with a voltage sensor 40 that is configured to convert the electrical potential generated by the touch-sensitive assembly 10, in use, to an output signal that can be utilized by a controller of the device into which the touch-sensitive assembly 10 is incorporated.

The touch-sensitive assembly 10 of the present disclosure can be incorporated into any suitable optical assembly for which it may be desirable to provide touch-sensitive capabilities. Non-limiting examples of optical assemblies which can include the touch-sensitive assembly 10 of the present disclosure include smart phones, smart devices, music players, e-book readers, tablets, laptop computers, automated teller machines, consumer kiosks, televisions, monitors, appliance user interfaces, interior mirror assemblies, exterior mirror assemblies, switchable eyewear, architectural window assemblies, aircraft window assemblies, filter assemblies, heads-up displays, and vehicle window assemblies. In one example, the touch-sensitive assembly 10 according to the present disclosure can be combined with a display having a light-emitting portion, and optionally one or more additional components, depending on the nature of the electronic device, to form a touch-sensitive surface (also referred to as a touchscreen). For example, the touch-sensitive assembly 10 can be combined with one or more liquid crystal layers, one or more organic light-emitting diode layers, and/or an electro-optic element to form a touchscreen suitable for use in a variety of different electronic devices and optical assemblies. According to one aspect, the touch-sensitive assembly can be one layer of a multi-layer touchscreen used in consumer electronic devices such as smart phones, smart devices, music players, e-book readers, tablets, laptop computers, automated teller machines, consumer kiosks, televisions, monitors, and appliance user interfaces. Additional layers including glass, glass-ceramic, or plastic substrates, filter layers, protective layers, optical coatings, scratch-resistant coatings, anti-reflection coatings, etc., can be combined with the touch-sensitive assembly 10 of the present disclosure to form a touchscreen according to methods known in the field. As used herein, the term display refers to any element or assembly by which information can be communicated to a viewer of the display, non-limiting examples of which include an LCD, a vacuum fluorescent display, an LED, an OLED, an electrophoretic display, and an icon. As used herein, information may be in the form of text, images, graphics, symbols, indicators, and combinations thereof. According to one aspect of the present disclosure, the touch-sensitive assembly 10 can be used with a display that includes a light-emitting portion for communicating information by the display. In some aspects, the touch-sensitive assembly 10 can be combined with the display such that at least a portion of the light emitted by the light-emitting portion of the display passes through the touch-sensitive assembly 10. In some aspects, the optical assembly can be configured such that the touch-sensitive assembly 10 is disposed between the display and an exterior touch surface of the optical assembly. As used herein, the exterior touch surface refers to the surface which is configured to be contacted by a viewer of the optical assembly during operation of the optical assembly by the viewer through the use of the touch-sensitive assembly 10.

Figure 3:
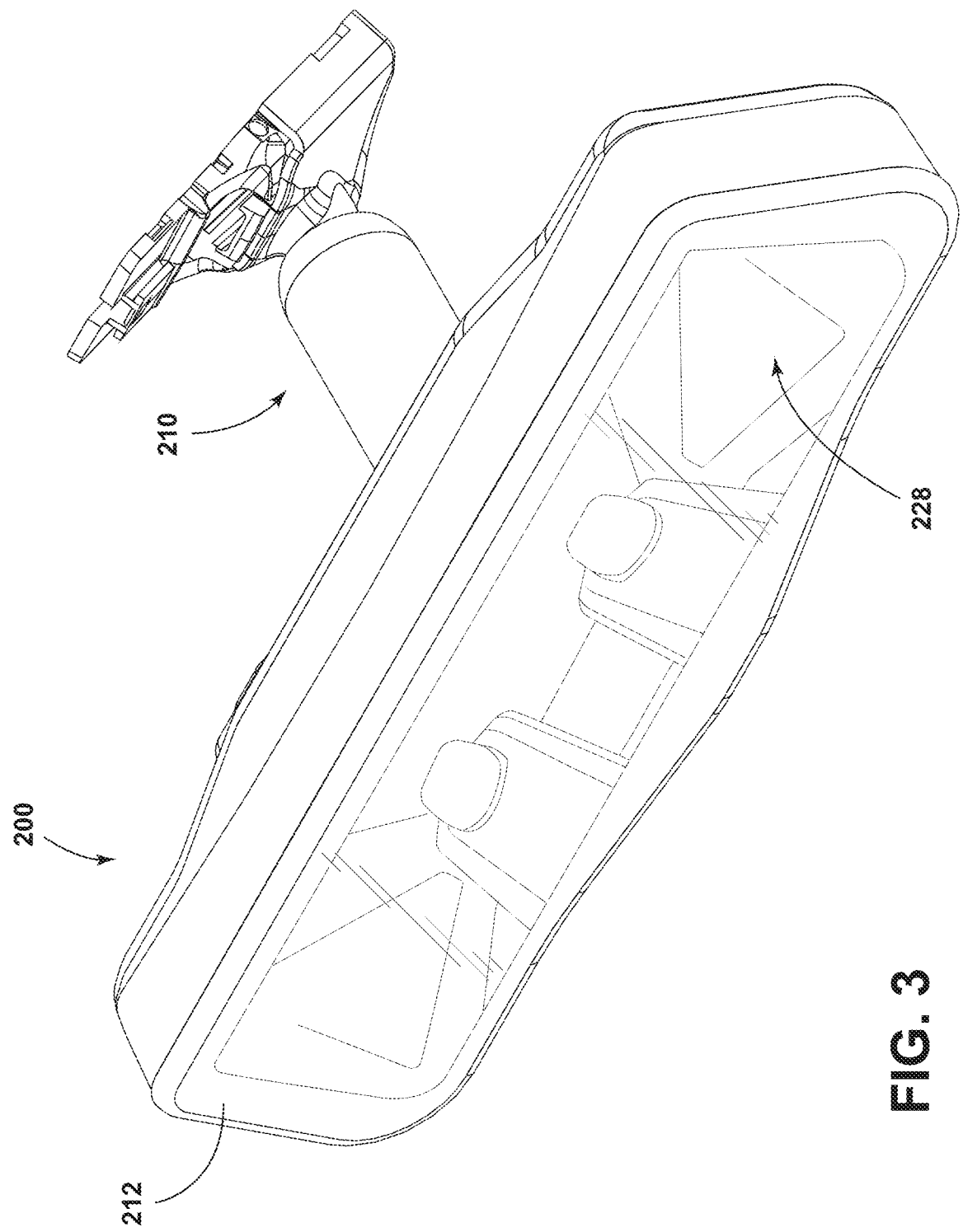
FIG. 3 is a perspective view of a rearview mirror assembly, according to an aspect of the present disclosure.
Figure 4:
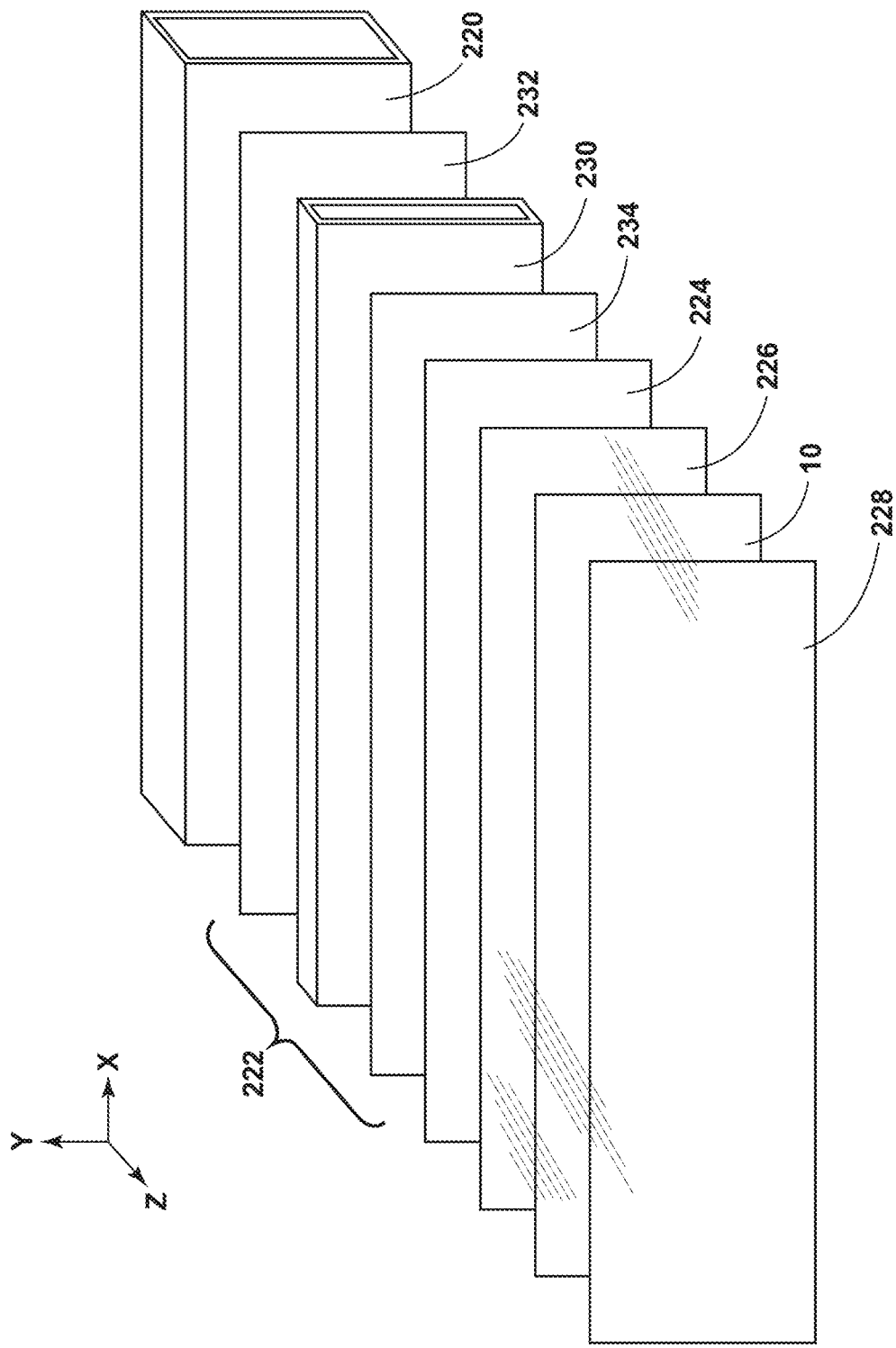
FIG. 4 is a partially exploded view of the rearview mirror assembly of FIG. 3, according to an aspect of the present disclosure.

Referring now to FIGS. 3 and 4, the touch-sensitive assembly 10 of the present disclosure is illustrated in the context of an optical assembly 200, illustrated in FIGS. 3 and 4 as a rearview mirror assembly, which includes an electro-optic element 228. When assembled with the optical assembly 200, the touch-sensitive assembly 10 transforms the optical assembly 200 into a touchscreen. While the optical assembly 200 is illustrated in FIGS. 3-4 in the context of a rearview mirror assembly, the optical assembly 200 can be any type of optical assembly, non-limiting examples of which include switchable eyewear, mirror assemblies, architectural window assemblies, aircraft window assemblies, filter assemblies, heads-up displays, vehicle window assemblies, and other optical assemblies, which may be positioned within bezels and/or housings or other support structures. The exemplary rearview mirror assembly 200 of FIGS. 3-4 can be an interior rearview assembly positioned within an interior of a vehicle. When the rearview mirror assembly 200 is an interior rearview assembly, the rearview mirror assembly 200 may be connected to a mount 210, which is adapted to be mounted inside the vehicle in a location proximate to or on a front windshield of the vehicle, and may optionally include a bezel 212.

Still referring to FIGS. 3 and 4, the optical assembly 200 can include, in order from a rear position (e.g., vehicle forward) to a front position (e.g., vehicle rearward), a light source 220, a display 222, an optional substrate 224, an optional reflective polarizer 226, the touch-sensitive assembly 10, and an electro-optic element 228. The light source 220, or light engine, is configured to backlight the display 222 by providing light to a rear of the display 222. Light from the light source 220 moves in a Z-direction through the optical assembly 200, through the display 222, and toward the electro-optic element 228. In the depicted example, the display 222 is a liquid crystal display incorporating a liquid crystal medium 230 disposed between two polarizers, an entrance polarizer 232 and an exit polarizer 234. The light source 220 and display 222 may optionally extend across substantially an entirety of portion of a length (X-direction) of the optical assembly 200, which may be referred to as a "full-display" assembly, or may only extend across portion of the length. It will be appreciated, however, that a concept of a "full-display" assembly, where the display 222, or a plurality of displays, located behind the electro-optic element 228, overlaps in projection onto a viewable surface of optical assembly 200, with most or all of this viewable surface, is also contemplated by the various examples of this disclosure. The display 222 and/or light source 220 may be angled (e.g., about 3° to about 5°) relative to the reflective polarizer 226 and may optionally include an optical bonding adhesive disposed between display 222, the optional reflective polarizer 226, the optional substrate 224 and other locations. It is within the scope of the present disclosure for different displays and/or light sources to be utilized with the touch-sensitive assembly 10 in the rearview mirror assembly 200 of the exemplary embodiment of FIGS. 3-4 or any other type of mirror assembly, optical assembly, and/or electronic device. Additional and/or alternative components, such as glass, glass-ceramic, or plastic substrates, filter layers, protective layers, optical coatings, scratch-resistant coatings, anti-reflection coatings, etc., can be combined with the touch-sensitive assembly 10 in the optical assembly 200.

While the touch-sensitive film 10 is illustrated in FIG. 4 as being disposed rearward of the electro-optic assembly 228, it is within the scope of the present disclosure for the touch-sensitive assembly 10 to be disposed in front of the electro-optic assembly 228 in the embodiment of the rearview mirror assembly 200 of FIGS. 3-4 and in any other type of optical assembly or electronic device into which the touch-sensitive assembly 10 is incorporated. Optionally, the touch-sensitive film 10 can be sandwiched between the electro-optic assembly 228 and one or more additional components, such as a protective component, examples of which include a glass substrate, a polymeric substrate, and/or a polymeric laminate.

The entrance and/or exit polarizers 232, 234 may include a reflective polarizer which may be a linear polarizer, an elliptical polarizer or a circular polarizer and might include an optical retarder such as a quarter-wave plate or a half-wave plate. A wire-grid polarizer provides one example of a reflective polarizer that may be used for the entrance and/or exit polarizers 232, 234. Alternatively, a reflective polarizer may include a polymer-based film structure including at least one optically anisotropic layer. Such polymer-based film structure is generally referred to herein as an anisotropic polymer-based film (APBF). Non-limiting examples of APBFs are provided by a multilayered polymer film, including a body of alternating layers of a crystalline-based polymer and another selected polymer, or by micro-structured film-based polarizers, such as brightness enhancement films, or by dual brightness enhancement films. It is understood that the entrance and/or exit polarizers 232, 234 may be absent, substituted with other components, or used in combination with other components, based at least in part on the type of display 222 incorporated into the optical assembly 200 and/or the intended use of the optical assembly 200.

Positioned vehicle rearward of the display 222 is the optional substrate 224 and the optional reflective polarizer 226. The optional substrate 224 may be a piece of glass, polymer or other sufficiently optical clear component configured to transmit light from the display 222. The reflective polarizer 226 may be positioned on the substrate 224 (e.g., on a vehicle forward or vehicle rearward surface). In a specific example, the reflective polarizer 226 may be laminated onto a surface of the substrate 224. The reflective polarizer 226 substantially transmits light having one type of polarization, while substantially reflecting light of another polarization. This may produce an effect of making the rearview mirror assembly 200 essentially transparent to the light having the first polarization generated by the display 222 and/or light source 220, while maintaining a useful level of overall reflectance of unpolarized ambient light having the second polarization incident upon the rearview mirror assembly 200. Similar to the entrance and/or exit polarizers 232, 234, the reflective polarizer 226 may be a linear polarizer, an elliptical polarizer or a circular polarizer and might include an optical retarder such as a quarter-wave plate or a half-wave plate. As explained above, a wire-grid polarizer provides one example of the reflective polarizer 226. Alternatively, the reflective polarizer 226 may include a polymer-based film structure comprising at least one APBF. It is understood that the optional substrate 224 and/or optional reflective polarizer 226 may be absent, substituted with other components, or used in combination with other components, based at least in part on the type of display 222 incorporated into the optical assembly 200 and/or the intended use of the optical assembly 200.

The rearview mirror assembly 200 can be coupled with a suitable printed circuit board (PCB) configured to control the functional features of the rearview mirror assembly 200. The touch-sensitive assembly 10 can also be coupled with the PCB to allow a user to provide input to the mirror assembly 200 by pressing an accessible side of the electro-optic element 228. Application of pressure to the electro-optic element 228 can be registered by the touch-sensitive assembly 10 and converted to an output signal that is received by the PCB as an input signal. In this manner, input can be provided to the rearview mirror assembly 200 by the user without the use of mechanical buttons or switches. In some examples, the electro-optic element 228 may provide the exterior touch surface that a viewer contacts while interacting with the optical assembly 200. In some examples, an additional component may be provided in front of the electro-optic element 228, and the additional component may provide the exterior touch surface that is contacted by a viewer during interaction of the viewer with the optical assembly 200. While the touch-sensitive assembly 10 is illustrated as being disposed behind the electro-optic element 228, in some aspects, the touch-sensitive assembly 10 can be disposed in front of the optical assembly 200.

Figure 5:
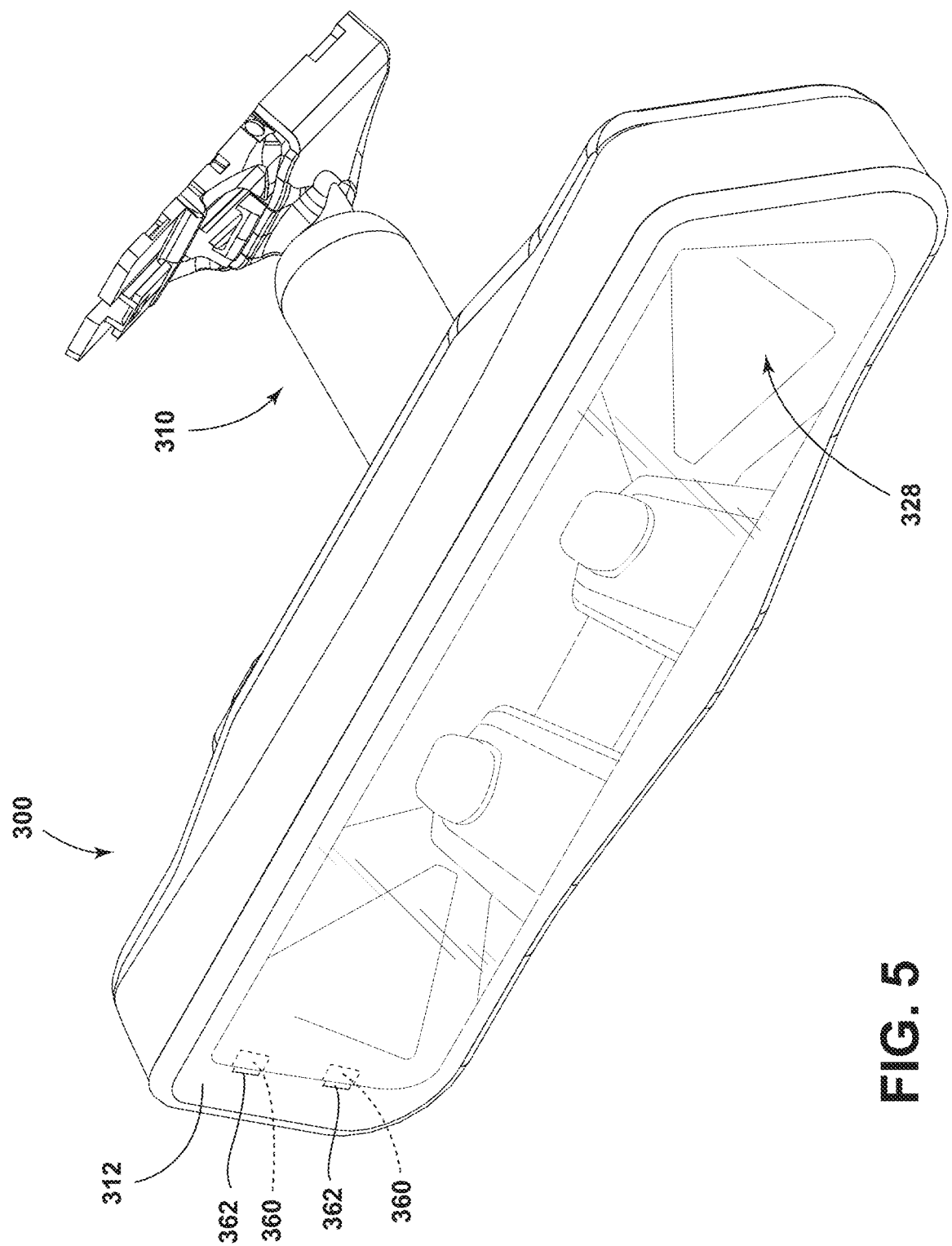
FIG. 5 is a perspective view of a rearview mirror assembly, according to an aspect of the present disclosure.

FIG. 5 illustrates another exemplary optical assembly 300, according to an aspect of the present disclosure, which is similar in some aspects to the rearview mirror assembly 200 of FIGS. 3 and 4, except that the piezoelectric particles are localized in predetermined areas 360 of the touch-sensitive assembly 10. As such, elements having the same or substantially similar functions and structures have been labeled with the prefix 300, unless otherwise specified. As illustrated in FIG. 5, the touch-sensitive assembly 10 can be provided with the aligned piezoelectric particles only in predetermined areas 360 and thus only those areas 360 of the rearview mirror assembly 300 will exhibit touch-sensitive functionality. Application of pressure to the electro-optic element 328 in the areas overlapping with the touch-sensitive areas 360 can be registered by the touch-sensitive assembly 10 and converted to an output signal that is received by the PCB as an input signal in a manner similar to that disclosed above. In this manner, the rearview mirror assembly 300 can be provided with touch-sensitive functionality only where needed to control functionality of the mirror assembly 300. Limiting the piezoelectric particles to discrete touch-sensitive areas 360 can save on materials and manufacturing costs and a Iso leaves a majority of the display surface of the electro-optic element 328 unimpeded by the optical characteristics of the piezoelectric particles. Optionally, the rearview mirror assembly 300 can include indicators 362, such as indicia, on the adjacent portion of the mirror bezel 312 (shown) or an illuminated or colored portion of the electro-optic assembly 328, to indicate the location of the touch-sensitive areas 360.

While the piezoelectric films and touch-sensitive assemblies of the present disclosure are discussed in the context of the optical assemblies 200 and 300, aspects of the present disclosure can also be utilized in rearview mirror assemblies and/or other types of optical assemblies having different and/or additional components and/or a different arrangement of components than the optical assemblies 200 and 300 of FIGS. 3-4 and FIG. 5, respectively. For example, while the optical assemblies 200 and 300 utilize a reflective polarizer, the piezoelectric films and touch-sensitive assemblies of the present disclosure can be utilized in optical assemblies that utilize a silvered reflective conductive layer in the electro-optic element instead of a reflective polarizer.

The piezoelectric films and touch-sensitive assemblies of the present disclosure can be utilized in combination with any suitable type of electro-optic element in an optical assembly. As used herein, an electro-optic element refers to an element that is capable of transitioning between a substantially clear or transparent state and a substantially dark or darkened state and/or intermediate states therebetween through the use of electrochromic components which exhibit a change in extinction coefficient at one or more wavelengths upon exposure to a particular electrical potential difference. The electrochromic components include those materials whose color and/or opacity are affected by an electrical current such that, when an electrical field is applied to the material, the color and/or opacity of the material changes from a first phase to a second phase.

Figure 6:
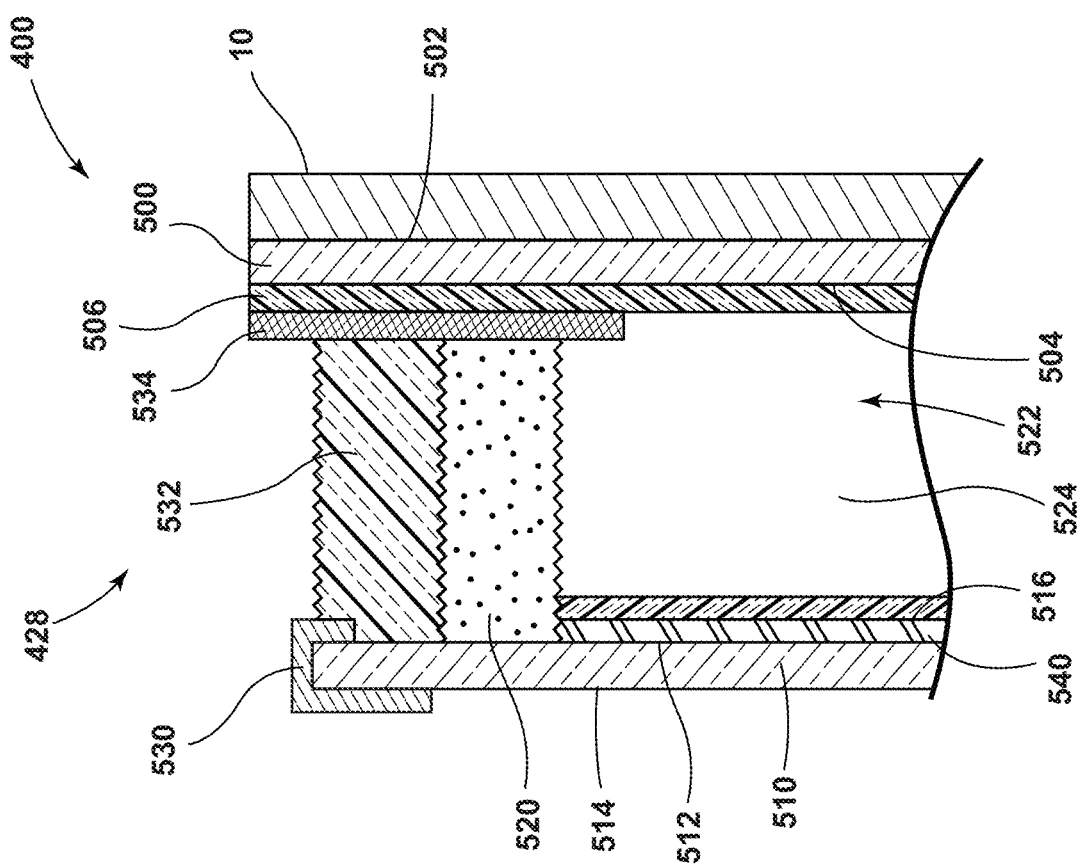
FIG. 6 is a perspective view of a mirror assembly, according to an aspect of the present disclosure.

FIG. 6 illustrates another exemplary optical assembly 400 according to an aspect of the present disclosure, which is similar in some aspects to the optical assembly 200 of FIGS. 3 and 4, except for the optical assembly 400 includes some different components. As such, like elements having the same or substantially similar functions and structures as those of the optical assembly 200 of FIGS. 3-4 have been labeled with the prefix 400, unless otherwise specified. When assembled with the optical assembly 400, the touch-sensitive assembly 10 can transform the optical assembly 400 into a touchscreen.

The optical assembly 400 includes an electro-optic assembly 428 and the touch-sensitive assembly 10 according to an aspect of the present disclosure. The optical assembly 400 can optionally include one or more additional components, not illustrated, disposed in front of and/or behind the electro-optic assembly 428, non-limiting examples of which include displays, LCD displays, icon overlays, reflectors, polarizers, protective components, glass, glass-ceramic, and/or plastic substrates, filter layers, optical coatings, scratch-resistant coatings, anti-reflection coatings, etc. to provide the optical assembly 400 with both electro-optic and touch-sensitive capabilities, in addition to the desired optical and/or display functionalities.

The electro-optic assembly 428 can include a first substantially transparent substrate 500 having a first surface 502 and a second surface 504 disposed on opposite sides thereof. The second surface 504 can include a first electrically conductive layer 506. A second substantially transparent substrate 510 includes a third surface 512 and a fourth surface 514 disposed on opposite sides thereof. The third surface 512 can include a second electrically conductive layer 516. A primary seal 520 can be disposed between the first and second substrates 500, 510, wherein the primary seal 520 and the first and second substrates 500, 510 define a cavity 522 therebetween. An electro-optic medium 524 can be disposed in the cavity 522. The electro-optic medium 524 can be variably transmissive such that the electro-optic assembly 428 is capable of transitioning between a substantially clear or transparent state and a substantially dark or darkened state and/or intermediate states therebetween through the use of electrochromic components in the electro-optic medium 524 which exhibit a change in extinction coefficient and/or phase at one or more wavelengths upon exposure to a particular electrical potential difference. One or more electrical connections 530 can be provided to selectively provide electrical power to the electro-optic medium 524. Additional components, such as an electrical conductor 532 and a spectral filter 534 may also be provided. In some embodiments, the electro-optic assembly 428 can include an optional film 540 disposed adjacent to the second substrate 510 and/or the second electrically conductive layer 516 that can be reflective, transmissive, or a combination of partially reflective and partially transmissive. The optional film 540 can be configured to allow the electro-optic assembly 428 to be utilized as a reflective mirror in the absence of a display or when the display is powered off (i.e., not emitting light).

The touch-sensitive film 10 can be in front of the electro-optic assembly 428 (as illustrated) and optionally sandwiched between the electro-optic assembly 428 and one or more other components of the optical assembly 400, non-limiting examples of which include a protective component, a glass or polymeric cover piece or substrate, a polymeric laminate, a housing component, and/or a structural support component. Optionally, the touch-sensitive film 10 may be disposed behind the electro-optic assembly 428 and optionally sandwiched between the electro-optic assembly 428 and one or more additional components, such as a protective component, non-limiting examples of which include a protective component, a glass or polymeric cover piece or substrate, a polymeric laminate, a housing component, a display (e.g., LCD display), icon overlays, reflectors, and polarizers.

While the piezoelectric films and touch-sensitive assemblies of the present disclosure are discussed in the context of a rear view mirror assembly, it is within the scope of the present disclosure for the piezoelectric films and touch-sensitive assemblies to be utilized alone or in combination with an electro-optic element in any type of consumer electronic device or optical assembly to provide touch-sensitive features (e.g., a touchscreen), non-limiting examples of which include smart phones, smart devices, music players, e-book readers, tablets, laptop computers, automated teller machines, consumer kiosks, televisions, monitors, appliance user interfaces, interior mirror assemblies, exterior mirror assemblies, switchable eyewear, architectural window assemblies, aircraft window assemblies, filter assemblies, heads-up displays, and vehicle window assemblies.

The following non-limiting aspects are encompassed by the present disclosure. To the extent not already described, any one of the features of the following aspects may be combined in part or in whole with features of any one or more of the other aspects of the present disclosure to form additional aspects, even if such a combination is not explicitly described.

According to a first aspect of the present disclosure, a touch-sensitive assembly includes a first electrically conductive layer disposed on a first substrate and a second electrically conductive layer disposed on a second substrate. A piezoelectric film is disposed between the first electrically conductive layer and the second electrically conductive layer and comprises a plurality of aligned piezoelectric particles disposed in a polymeric matrix. The piezoelectric film is characterized by a haze value of about 5% or less.

According to the first aspect of the present disclosure, a difference in an index of refraction of the piezoelectric particles and an index of refraction of the polymeric matrix is less than about ±1, as measured for at least one wavelength in the range of from about 400 nm to about 700 nm.

According to the first aspect or any intervening aspects, a difference in an index of refraction of the piezoelectric particles and an index of refraction of the polymeric matrix is less than about ±0.25, as measured for at least one wavelength in the range of from about 400 nm to about 700 nm.

According to the first aspect or any intervening aspects, the piezoelectric particles are selected from of quartz, lithium niobate, barium titanate, lead zirconate titanate (PZT), barium zirconate titanate (BZT), lanthanum gallium silicate (langasite), gallium orthophosphate, lithium tantalate, potassium niobite, sodium tungstate, zinc oxide, materials having a wurtzite crystal structure, sodium potassium niobate, bismuth ferrite, bismuth titanate, and combinations thereof.

According to the first aspect or any intervening aspects, the polymeric matrix is selected from a silicone-based polymer, polydimethylsiloxane, polycarbonate-based polymer, acrylate-based polymer, urethane-based polymer, and combinations thereof.

According to the first aspect or any intervening aspects, the polymeric matrix includes a thermally curable resin or a radiation curable resin.

According to the first aspect or any intervening aspects, the polymeric matrix is characterized by at least about 20% specular transmittance to light having a wavelength within the range of from about 400 nm to about 700 nm.

According to the first aspect or any intervening aspects, the piezoelectric particles are present in an amount of from about 0.05% by weight to about 0.5% by weight.

According to the first aspect or any intervening aspects, the first electrically conductive layer and the second electrically conductive layer are selected from indium tin oxide (ITO), doped zinc oxide, indium zinc oxide (IZO), fluorine doped tin oxide (FTO), insulator/metal/insulator (IMI), carbon nanotubes, graphene, conductive nanowire coating, conductive metal mesh, conductive nanoparticle filled polymer, conductive polymer, and combinations thereof.

According to the first aspect or any intervening aspects, further including a display area including at least one touch-sensitive portion and at least one portion that is not touch-sensitive, and wherein the piezoelectric particles are present in the at least one touch-sensitive portion and substantially absent in the at least one portion that is not touch-sensitive.

According to the first aspect or any intervening aspects, the polymeric matrix further includes at least one filler, wherein at least one of a type and amount of the at least one filler is selected to change an index of refraction of the polymeric matrix such that a difference in an index of refraction of the piezoelectric particles and an index of refraction of the polymeric matrix is less than about ±1, as measured for at least one wavelength in the range of from about 400 nm to about 700 nm.

According to the first aspect or any intervening aspects, the piezoelectric particles includes a first index of refraction and the polymeric matrix includes a second index of refraction, and further including: (a) a coating disposed on the piezoelectric particles, wherein the coating is characterized by a third index of refraction that is intermediate between the first index of refraction and the second index of refraction, (b) a gradient coating disposed on the piezoelectric particles, wherein the gradient coating comprises a fourth index of refraction adjacent an interface between the piezoelectric particles and the gradient coating and a fifth index of refraction adjacent an interface between the polymeric matrix and the gradient coating; or a combination of (a) and (b).

According to the first aspect or any intervening aspects, the gradient coating includes a thickness of about 5 nm to about 500 nm.

According to the first aspect or any intervening aspects, the piezoelectric particles are characterized by an average surface roughness $R_a$ of less than about 5 micrometers.

According to the first aspect or any intervening aspects, the piezoelectric particles are characterized by an average surface roughness $R_a$ of less than about 250 nanometers.

According to the first aspect or any intervening aspects, the first substrate and the second substrate are selected from borosilicate glass, soda lime glass, natural and synthetic polymeric resins, polyesters, polyimides, polycarbonates, polysulfones, polyethylene naphthalate, ethylene vinyl acetate, acrylate polymers, cyclic olefin polymers, and cyclic olefin copolymers.

According to the first aspect or any intervening aspects, the piezoelectric particles are present as an array of discrete groupings of piezoelectric particles within the polymeric matrix.

According to the first aspect or any intervening aspects, at least one of a longitudinal distance and lateral distance between the discrete groupings of piezoelectric particles is about 1 nanometer.

According to the first aspect or any intervening aspects, the first electrically conductive layer and the second electrically conductive layer are spaced from one another along a first axis, and wherein the piezoelectric particles are aligned along the first axis.

According to a second aspect of the present disclosure, an optical assembly includes a touch-sensitive assembly according to any one of the previous aspects and further comprises a display configured to communicate information with a viewer of the display.

According to the second aspect, the optical assembly further includes at least one component selected from a liquid crystal layer, organic light-emitting diode layer, and electro-optic element configured to transition between substantially clear and substantially darkened states.

According to a third aspect of the present disclosure, a method of making a touch-sensitive assembly includes providing a first electrically conductive layer disposed on a first substrate and providing a second electrically conductive layer disposed on a second substrate. A piezoelectric film is provided between the first electrically conductive layer and the second electrically conductive layer, wherein the piezoelectric film includes a plurality of aligned piezoelectric particles disposed in a polymeric matrix. The piezoelectric film is characterized by a haze value of about 5% or less.

According to the third aspect, the method further includes, prior to the step of providing a piezoelectric film between the first electrically conductive layer and the second electrically conductive layer, providing a first material selected from a polymer solution, polymer melt, reactive monomers, reactive prepolymers, and combinations thereof, wherein the first material comprises the piezoelectric particles dispersed therein; and applying an electric field to the first material to align the piezoelectric particles along a first axis to form a second material.

According to the third aspect or any intervening aspects, the piezoelectric particles are provided in the first material in an amount of from about 0.05% by weight to about 0.5% by weight.

According to the third aspect or any intervening aspects, the method further includes, subsequent to the step of applying an electric field, solidifying the second material to form the polymeric matrix comprising the aligned piezoelectric particles.

According to the third aspect or any intervening aspects, the step of solidifying the second material is selected from heating the second material, evaporating a solvent from the second material, cooling the second material, thermally curing the second material, and radiation curing the second material.

According to the third aspect or any intervening aspects, the piezoelectric particles form an array of discrete groupings within the polymeric matrix.

According to the third aspect or any intervening aspects, a lateral distance between the discrete groupings of piezoelectric particles is about 1 nanometer.

According to the third aspect or any intervening aspects, the step of providing a first material further includes providing at least one filler dispersed within the first material, wherein at least one of a type and amount of the at least one filler is selected to change an index of refraction of the polymeric matrix such that a difference in an index of refraction of the piezoelectric particles and an index of refraction of the polymeric matrix is less than about ±1, as measured for at least one wavelength in the range of from about 400 nm to about 700 nm.

According to the third aspect or any intervening aspects, a difference in an index of refraction of the piezoelectric particles and an index of refraction of the polymeric matrix is less than about ±0.25, as measured for at least one wavelength in the range of from about 400 nm to about 700 nm.

According to the third aspect or any intervening aspects, the piezoelectric particles are selected from quartz, lithium niobate, barium titanate, lead zirconate titanate (PZT), barium zirconate titanate (BZT), lanthanum gallium silicate (langasite), gallium orthophosphate, lithium tantalate, potassium niobite, sodium tungstate, zinc oxide, materials having a wurtzite crystal structure, sodium potassium niobate, bismuth ferrite, bismuth titanate, and combinations thereof.

According to the third aspect or any intervening aspects, the first electrically conductive layer and the second electrically conductive layer are selected from indium tin oxide (ITO), doped zinc oxide, indium zinc oxide (IZO), fluorine doped tin oxide (FTO), insulator/metal/insulator (IMI), carbon nanotubes, graphene, conductive nanowire coating, conductive metal mesh, conductive nanoparticle filled polymer, conductive polymer, and combinations thereof.

According to the third aspect or any intervening aspects, the touch-sensitive assembly includes a display area comprising at least one touch-sensitive portion and at least one portion that is not touch-sensitive, the method further including providing the piezoelectric particles in the at least one touch-sensitive portion, wherein the at least one portion that is not touch-sensitive is substantially free of piezoelectric particles.

According to the third aspect or any intervening aspects, the piezoelectric particles includes a first index of refraction and the polymeric matrix includes a second index of refraction, and wherein the piezoelectric particles further include: (a) a coating disposed on the piezoelectric particles, wherein the coating is characterized by a third index of refraction that is intermediate between the first index of refraction and the second index of refraction, (b) a gradient coating disposed on the piezoelectric particles, wherein the gradient coating comprises a fourth index of refraction adjacent an interface between the piezoelectric particles and the gradient coating and a fifth index of refraction adjacent an interface between the polymeric matrix and the gradient coating; or a combination of (a) and (b).

According to the third aspect or any intervening aspects, the gradient coating includes a thickness of about 5 nm to about 500 nm.

According to the third aspect or any intervening aspects, the piezoelectric particles are characterized by an average surface roughness $R_a$ of less than about 5 micrometers.

According to the third aspect or any intervening aspects, the piezoelectric particles are characterized by an average surface roughness $R_a$ of less than about 250 nanometers.

According to the third aspect or any intervening aspects, the first substrate and the second substrate are selected from borosilicate glass, soda lime glass, natural and synthetic polymeric resins, polyesters, polyimides, polycarbonates, polysulfones, polyethylene naphthalate, ethylene vinyl acetate, acrylate polymers, cyclic olefin polymers, and cyclic olefin copolymers.

According to the third aspect or any intervening aspects, wherein the polymeric matrix is selected from a silicone-based polymer, polydimethylsiloxane, polycarbonate-based polymer, acrylate-based polymer, urethane-based polymer, and combinations thereof.

According to the third aspect or any intervening aspects, the polymeric matrix is characterized by at least about 20% specular transmittance to light having a wavelength within the range of from about 400 nm to about 700 nm.

Modifications of the disclosure will occur to those skilled in the art and to those who make or use the concepts disclosed herein. Therefore, it is understood that the embodiments shown in the drawings and described above are merely for illustrative purposes and not intended to limit the scope of the disclosure, which is defined by the following claims as interpreted according to the principles of patent law, including the doctrine of equivalents.

It will be understood by one having ordinary skill in the art that construction of the described concepts, and other components, is not limited to any specific material. Other exemplary embodiments of the concepts disclosed herein may be formed from a wide variety of materials, unless described otherwise herein.

For purposes of this disclosure, the term "coupled" (in all of its forms: couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature, or may be removable or releasable in nature, unless otherwise stated.

It is also important to note that the construction and arrangement of the elements of the disclosure, as shown in the exemplary embodiments, is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts, or elements shown as multiple parts may be integrally formed, the operation of the interfaces may be reversed or otherwise varied, the length or width of the structures and/or members or connector or other elements of the system may be varied, and the nature or numeral of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes, or steps within described processes, may be combined with other disclosed processes or steps to form structures within the scope of the present disclosure. The exemplary structures and processes disclosed herein are for illustrative purposes and are not to be construed as limiting.

It is also to be understood that variations and modifications can be made on the aforementioned structures and methods without departing from the concepts of the present disclosure, and further, it is to be understood that such concepts are intended to be covered by the following claims, unless these claims, by their language, expressly state otherwise.

What is claimed is:

1. A touch-sensitive assembly, comprising:
   a first electrically conductive layer disposed on a first substrate;
   a second electrically conductive layer disposed on a second substrate; and
   a piezoelectric film disposed between the first electrically conductive layer and the second electrically conductive layer, wherein the piezoelectric film comprises a plurality of aligned piezoelectric particles disposed in a polymeric matrix, and
   wherein the piezoelectric film is characterized by a haze value of about 5% or less; and
   wherein the polymeric matrix further comprises:
      a filler, wherein at least one of a type and amount of the filler is selected to change an index of refraction of the polymeric matrix such that a difference in an index of refraction of the piezoelectric particles and the index of refraction of the polymeric matrix is less than about ±1, as measured for at least one wavelength in the range of from about 400 nm to about 700 nm.

2. The touch-sensitive assembly of claim 1, wherein the polymeric matrix comprises a silicone-based polymer resin, and atoms of a metal take the place of a portion of silicon atoms in the polymeric matrix to change the refractive index of the polymeric matrix to be closer to the index of refraction of the piezoelectric particles.

3. The touch-sensitive assembly of claim 1, wherein the piezoelectric particles are selected from quartz, lithium niobate, barium titanate, lead zirconate titanate (PZT), barium zirconate titanate (BZT), lanthanum gallium silicate (langasite), gallium orthophosphate, lithium tantalate, potassium niobite, sodium tungstate, zinc oxide, materials having a wurtzite crystal structure, sodium potassium niobate, bismuth ferrite, bismuth titanate, and combinations thereof.

4. The touch-sensitive assembly of claim 1, wherein the polymeric matrix is selected from a silicone-based polymer, polydimethylsiloxane, polycarbonate-based polymer, acrylate-based polymer, urethane-based polymer, and combinations thereof.

5. The touch-sensitive assembly of claim 1, wherein the piezoelectric particles are present in an amount of from about 0.05% by weight to about 0.5% by weight.

6. The touch-sensitive assembly of claim 1, further comprising:
a display area comprising at least one touch-sensitive portion and at least one portion that is not touch-sensitive, and
wherein the piezoelectric particles are present in the at least one touch-sensitive portion and substantially absent in the at least one portion that is not touch-sensitive.

7. The touch-sensitive assembly of claim 1, wherein the filler is a ceramic.

8. The touch-sensitive assembly of claim 1, wherein the piezoelectric particles are characterized by an average surface roughness $R_a$ of less than about 5 micrometers.

9. An optical assembly comprising the touch-sensitive assembly of claim 1, and further comprising:
a display configured to communicate information with a viewer of the display.

10. A method of making a touch-sensitive assembly, comprising:
providing a first electrically conductive layer disposed on a first substrate;
providing a second electrically conductive layer disposed on a second substrate;
providing (i) a first material selected from a polymer solution, polymer melt, reactive monomers, reactive prepolymers, and combinations thereof, and (ii) piezoelectric particles dispersed within the first material;
applying an electric field to the first material to align the piezoelectric particles along a first axis to form a second material;
solidifying the second material to form a piezoelectric film comprising aligned piezoelectric articles disposed within a polymeric matrix; and
disposing the piezoelectric film between the first electrically conductive layer and the second electrically conductive layer,
wherein the piezoelectric film is characterized by a haze value of about 5% or less;
wherein the polymeric matrix comprises a silicone-based polymer resin, and atoms of a metal take the place of a portion of silicon atoms in the polymeric matrix to change a refractive index of the polymeric matrix to be closer to an index of refraction of the piezoelectric particles; and
wherein a difference in the index of refraction of the piezoelectric articles and the index of refraction of the polymeric matrix is less than about 1, as measured for at least one wavelength in the range of from about 400 nm to about 700 nm.

11. The method of claim 10, wherein the metal comprises one or more of titanium, vanadium, and zirconium.

12. The method of claim 11, wherein the filler comprises particles with a size that is less than about 75 nm.

13. The method of claim 12, wherein the step of solidifying the second material is selected from heating the second material, evaporating a solvent from the second material, cooling the second material, thermally curing the second material, and radiation curing the second material.

14. The method of claim 10, wherein the step of providing a first material further comprises:
providing at least one filler dispersed within the first material, wherein at least one of a type and amount of the at least one filler is selected to change the index of refraction of the polymeric matrix to be closer to the index of refraction of the piezoelectric particles.

15. The method of claim 10, wherein the piezoelectric particles are selected from quartz, lithium niobate, barium titanate, lead zirconate titanate (PZT), barium zirconate titanate (BZT), lanthanum gallium silicate (langasite), gallium orthophosphate, lithium tantalate, potassium niobite, sodium tungstate, zinc oxide, materials having a wurtzite crystal structure, sodium potassium niobate, bismuth ferrite, bismuth titanate, and combinations thereof.

16. The method of claim 10, wherein the touch-sensitive assembly comprises a display area comprising at least one touch-sensitive portion and at least one portion that is not touch-sensitive, the method further comprising:
providing the piezoelectric particles in the at least one touch-sensitive portion, wherein the at least one portion that is not touch-sensitive is substantially free of piezoelectric particles.

17. The method of claim 10, wherein the piezoelectric particles comprise a first index of refraction and the polymeric matrix comprises a second index of refraction, and wherein the piezoelectric particles further comprise:
a coating disposed on the piezoelectric particles, wherein the coating is characterized by a third index of refraction that is intermediate between the first index of refraction and the second index of refraction;
a gradient coating disposed on the piezoelectric particles, wherein the gradient coating comprises a fourth index of refraction adjacent an interface between the piezoelectric particles and the gradient coating and a fifth index of refraction adjacent an interface between the polymeric matrix and the gradient coating; or
a combination thereof.

18. The method of claim 10, wherein the piezoelectric particles are characterized by an average surface roughness $R_a$ of less than about 5 micrometers.

19. The method of claim 10, wherein the polymeric matrix is selected from a silicone-based polymer, polydimethylsiloxane, polycarbonate-based polymer, acrylate-based polymer, urethane-based polymer, and combinations thereof.

20. A touch-sensitive assembly, comprising:
a first electrically conductive layer disposed on a first substrate;
a second electrically conductive layer disposed on a second substrate; and
a piezoelectric film disposed between the first electrically conductive layer and the second electrically conductive layer, wherein the piezoelectric film comprises:
a plurality of aligned piezoelectric particles disposed in a polymeric matrix, wherein the piezoelectric particles comprise a first index of refraction and the polymeric matrix comprises a second index of refraction; and
at least one of (i) a coating disposed on the piezoelectric particles, wherein the coating is characterized by a third index of refraction that is intermediate between the first index of refraction and the second index of refraction and (ii) a gradient coating disposed on the piezoelectric particles, wherein the gradient coating comprises a fourth index of refraction adjacent an interface between the piezoelectric particles and the gradient coating and a fifth index of refraction adjacent an interface between the polymeric matrix and the gradient coating;
wherein the piezoelectric film is characterized by a haze value of about 5% or less.

* * * * *

UNITED STATES PATENT AND TRADEMARK OFFICE
CERTIFICATE OF CORRECTION

PATENT NO. : 11,531,414 B2
APPLICATION NO. : 16/822413
DATED : December 20, 2022
INVENTOR(S) : Tonar et al.

It is certified that error appears in the above-identified patent and that said Letters Patent is hereby corrected as shown below:

In the Claims

Column 25:
Claim 10, Line 33;
"articles" should be – particles –.
Claim 10, Line 47;
"articles" should be – particles –.
Claim 10, Line 48;
After "about" insert -- ± --.

Signed and Sealed this
Twentieth Day of February, 2024

Katherine Kelly Vidal
*Director of the United States Patent and Trademark Office*